(12) United States Patent
Perez

(10) Patent No.: US 7,714,566 B2
(45) Date of Patent: May 11, 2010

(54) CLAMP-ON CURRENT AND VOLTAGE MODULE FOR A POWER MONITORING SYSTEM

(76) Inventor: Marcelo A. Perez, 24 Prescott Pl., Franklin, TN (US) 37069

(*) Notice: Subject to any disclaimer, the term of this patent is extended or adjusted under 35 U.S.C. 154(b) by 7 days.

(21) Appl. No.: 11/803,976

(22) Filed: May 16, 2007

(65) Prior Publication Data

US 2008/0284410 A1    Nov. 20, 2008

(51) Int. Cl.
  *G01R 19/22* (2006.01)
(52) U.S. Cl. ..................................... 324/120
(58) Field of Classification Search ............... 324/120
  See application file for complete search history.

(56) References Cited

U.S. PATENT DOCUMENTS

| | | | |
|---|---|---|---|
| 3,599,910 A | 8/1971 | Frank et al | |
| 3,828,291 A | 8/1974 | Urani | |
| 4,087,889 A * | 5/1978 | Ohba et al. | ............... 24/129 W |
| 4,148,542 A | 4/1979 | Wood | |
| 4,440,368 A | 4/1984 | Kitchen | |
| 4,532,486 A | 7/1985 | Terrier | |
| 4,672,508 A | 6/1987 | Bridges | |
| 4,695,913 A | 9/1987 | Terracol et al. | |
| 4,714,893 A * | 12/1987 | Smith-Vaniz et al. | ....... 324/126 |
| 4,716,496 A | 12/1987 | Fritsch | |
| 4,734,639 A | 3/1988 | Saletta et al. | |
| 4,962,443 A | 10/1990 | Cole | |
| 5,426,360 A * | 6/1995 | Maraio et al. | ............... 324/126 |
| 5,586,909 A | 12/1996 | Saba | |
| 6,109,575 A | 8/2000 | Munson | |
| 6,181,548 B1 | 1/2001 | Wheeler | |
| 6,329,810 B1 | 12/2001 | Reid | |
| 6,483,289 B2 | 11/2002 | Reid | |
| 6,713,997 B2 | 3/2004 | Carlson et al. | |
| 7,090,454 B2 | 8/2006 | Shain | |
| 7,180,717 B2 * | 2/2007 | Kojovic et al. | ................. 361/62 |
| 7,336,063 B1 * | 2/2008 | Bierer et al. | .............. 324/99 D |

OTHER PUBLICATIONS

SOCOMEC Group, "Operating Instructions for DIRIS Model A40/A41," Installation instructions, p. 10, date unknown (71 pages).
Merlin Gerin, "Technical Data Sheet 2003 Power-monitoring Unit PowerLogic System for Power Meter PM500," Installation and Connection, p. 7, 2003 (8 pages).

* cited by examiner

*Primary Examiner*—Ha Tran T Nguyen
*Assistant Examiner*—Shaun Campbell

(57) ABSTRACT

A clamp-on current and voltage module for an electrical power monitoring system that monitors characteristics of power distributed through one or more power conductors includes a current transformer having a core divided into at least two parts so that the core can be installed around a power conductor without cutting the conductor. The transformer produces a current signal corresponding to current passing through the power conductor. A pair of clamping elements fit on opposite sides of the conductor, for gripping the conductor. The transformer core parts and the clamping elements have engaging surfaces that prevent relative movement between the CT enclosure and the power conductor in a direction transverse to the axis of the power conductor. A voltage sensor makes electrical contact with the power conductor and produces a voltage signal corresponding to the voltage on the power conductor.

31 Claims, 13 Drawing Sheets

CLAMP-ON CURRENT AND VOLTAGE MODULE FOR A POWER MONITORING SYSTEM

FIELD OF THE INVENTION

The present invention relates generally to power monitoring systems and particularly to current and voltage modules ("CVM's") for use in such systems.

BACKGROUND OF THE INVENTION

Existing solutions for retrofitting a power monitoring system in an electrical installation, include use of clamp-on current transforms (CTs) with current output of 1 or 5 amperes, requiring the wiring of the CTs, shorting block, voltage input connections, voltage disconnect and voltage protection device. In a three-phase, four-wire circuit, this solution requires more than 30 wires with 61 connection points. Use of clamp-on electronic CT's reduces the safety hazard of the standard CT, eliminating the need for shorting blocks. However, in a three-phase, four-wire configuration, this solution still requires more than 22 wires with 45 connection points. Another limitation of this solution is decreased system accuracy, as the low-voltage-output CT's have lower accuracies than standard CT's, thus, reducing the overall accuracy of the power monitoring system.

Clamp-on metering devices (e.g., "Enercept" devices) are commercially available, but have significant limitations, including the requirement for an external connection for voltage inputs, poor accuracy (e.g., due to poor repeatability of the positioning of the conductor inside the CT), and the need for dedicated part numbers for a single solution (e.g., the "Enercept" comes with three CT's and cannot address single-phase applications. In addition, with this solution the meter and CT's are factory assembled, which, after installation, results in CT's and wires hanging from the main conductors.

SUMMARY OF THE INVENTION

A clamp-on current and voltage module for an electrical power monitoring system that monitors characteristics of power distributed through one or more power conductors includes a current transformer having a core divided into at least two parts so that the core can be installed around a power conductor without cutting the conductor. The transformer produces a current signal corresponding to current passing through the power conductor. In one embodiment, a pair of clamping elements fit over the current transformer enclosure, on opposite sides of the conductor, for gripping the conductor. The clamping elements are pressed against the conductor using a pressing device (e.g. wire tie). In another embodiment, a pair of clamping elements fit between the current transformer core and the power conductor, on opposite sides of the conductor, for gripping the conductor. The transformer core parts and the clamping elements have engaging surfaces that prevent relative movement between the engaging surfaces in a direction parallel to the axis of the power conductor when the transformer core parts are pressed against the clamping elements in a direction transverse to the axis of the power conductor. In both embodiments, a voltage sensor makes electrical contact with the power conductor and produces a voltage signal corresponding to the voltage on the power conductor.

In one embodiment, the clamp-on current and voltage module includes a voltage probe extending through one of the clamping elements, in a direction transverse to the axis of the power conductor, and making electrical contact with the power conductor for producing a voltage signal corresponding to the voltage on the power conductor.

One specific embodiment includes electrical circuitry integrated into at least one of the clamping elements for receiving the voltage signal and into the CT enclosure for receiving the current signals and converting those signals to digital signals. The circuitry also includes a burden resistor for the current transformer and a voltage divider for the voltage sensor, and may also include a power supply module for converting AC line voltage from the power conductor to a reduced DC control voltage for the power monitoring system.

Another specific embodiment includes electrical circuitry integrated into at least one of the transformer core parts for receiving the current and voltage signals and converting those signals to digital signals. The circuitry also includes a burden resistor for the current transformer and a voltage divider for the voltage sensor, and may also include a power supply circuit for converting AC line voltage from the power conductor to a reduced DC control voltage for the power monitoring system.

In one implementation, the clamping element surfaces that grip opposite sides of the power conductor form interdigital ribs that bite into insulation on the power conductor when the clamping elements are pressed against the insulation on opposite sides of the conductor. In an alternative embodiment, the clamping elements can open or close to accommodate different conductor diameters by pivoting two jaws around one axis.

In one specific implementation, the engaging surfaces of the clamping elements and the transformer core parts are angled and are longer on the clamping elements than on the transformer core parts, to accommodate different spacings between the clamping elements without changing the size of the transformer core parts. The longitudinal positions of the transformer core parts may simply be adjusted relative to the clamping elements.

BRIEF DESCRIPTION OF THE DRAWINGS

The foregoing and other advantages of the invention will become apparent upon reading the following detailed description and upon reference to the drawings, wherein.

Figure 1:
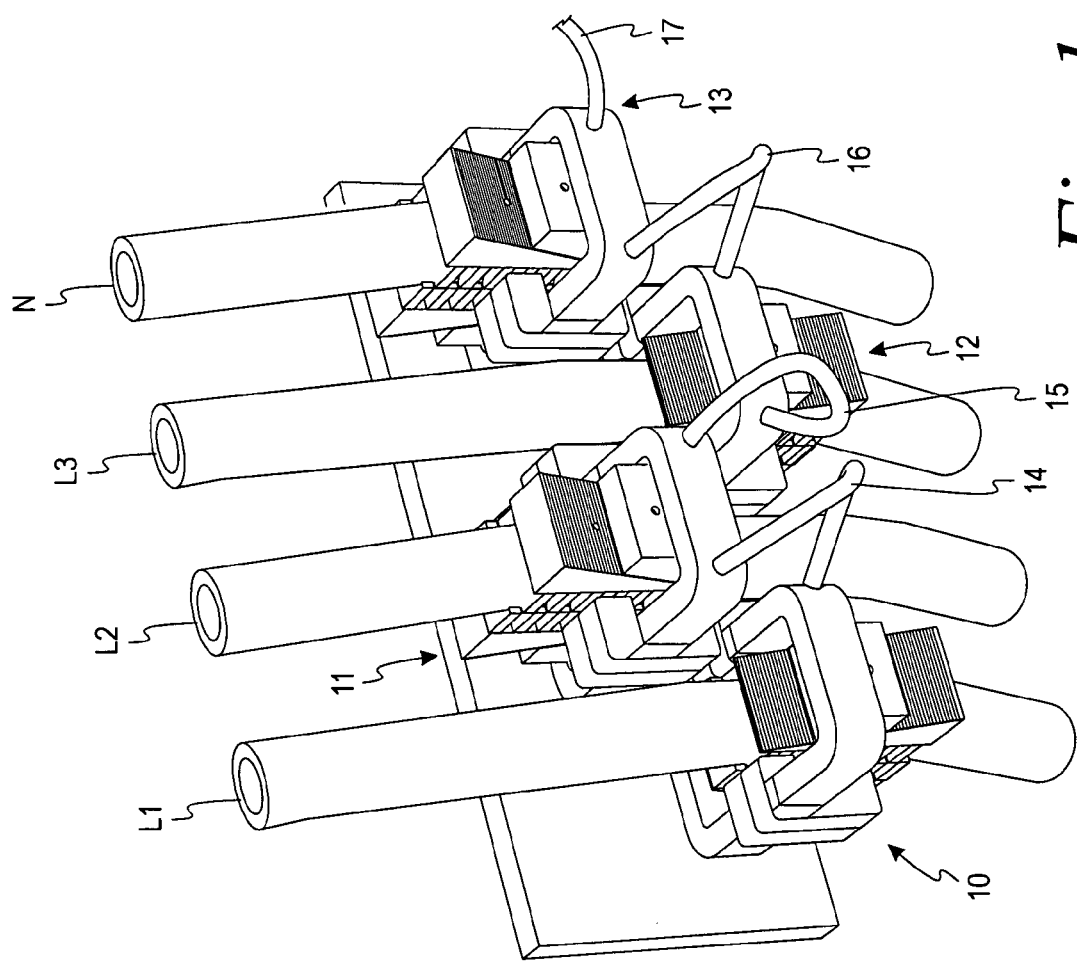
FIG. 1 is a perspective view of a set of four clamp-on current and voltage modules installed on the four conductors of a three-phase power distribution system.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Turning now to the drawings and referring first to FIG. 1, a set of four identical CVM's 10, 11, 12 and 13 are coupled to the four insulated conductors L1, L2, L3 and N of a three-phase power distribution system. Each CVM 10-13 is clamped tightly around the insulation of one of the power conductors L1-L3 and N so that any current flowing in that conductor is sensed by the CVM, which produces a corresponding current signal for use in a power monitoring system. In addition, each CVM also includes a voltage sensor that produces a corresponding voltage signal for use in the power monitoring system.

The analog output signals from both the current sensors and the voltage sensors in the CVM are converted to a digital signal in analog-to-digital ("A/D") converters built into the CVM's 10-13. The resulting digital output signals from the A/D converters can be fed to a processor that executes a series of calculations designed to monitor multiple characteristics of the power being distributed via the conductors L1-L3 and N. The CVM also contains built-in signal conditioning circuitry, between the sensors and the A/D converters, to condition the sensor output signals for presentation to the A/D converters.

When more than one CVM is used, as in the application illustrated in FIG. 1, the digital outputs of the multiple CVM's may be connected to a sensor base module containing a power supply or daisy-chained so that those outputs are communicated to the downstream processor serially in a single communication channel. In the illustrative embodiment of FIG. 1, the four CVM's 10-13 are daisy chained by four cable segments 14-17, with the final segment 17 being coupled to the downstream processor, or to a module containing that processor.

As will become apparent from the following description, the illustrated CVM's offer a number of advantages over CVM's that have been previously used or proposed, including ease and flexibility of installation, a reduced footprint, minimal wiring requirements, and a reduced number of parts.

Figure 2A:
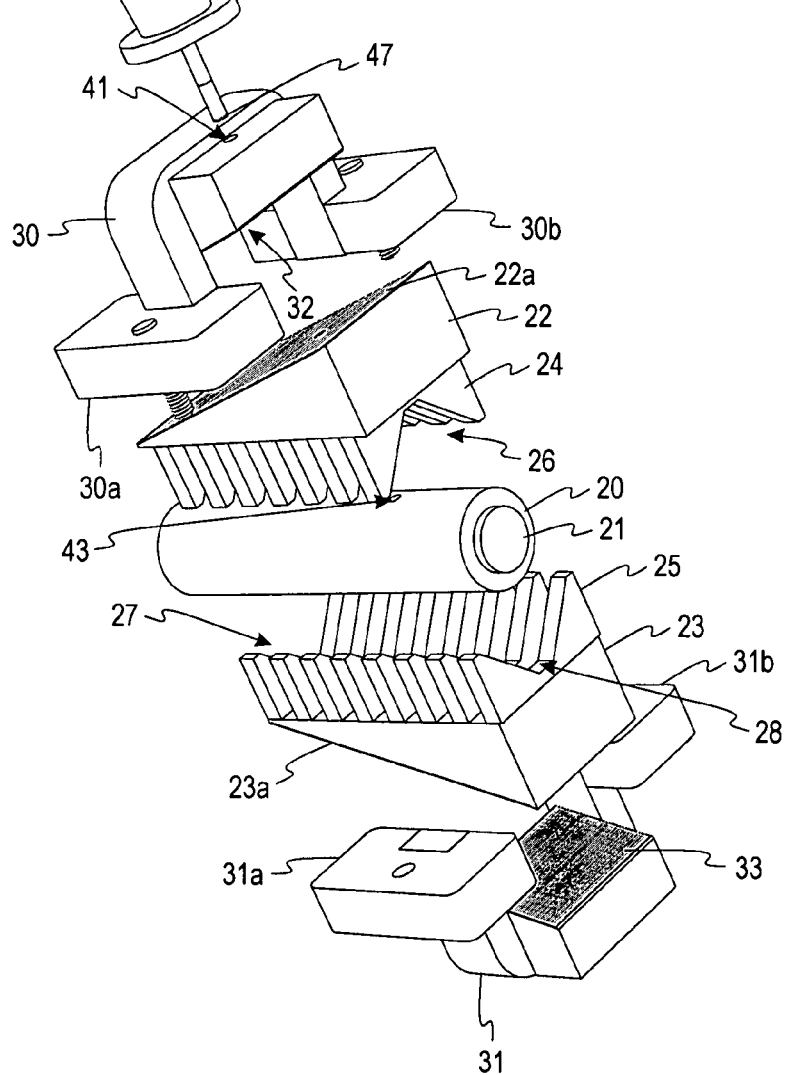
FIG. 2 is an enlarged, exploded perspective view of one of the clamp-on current and voltage modules shown in FIG. 1, along with a tool used in the installation of the module.
Figure 2B:
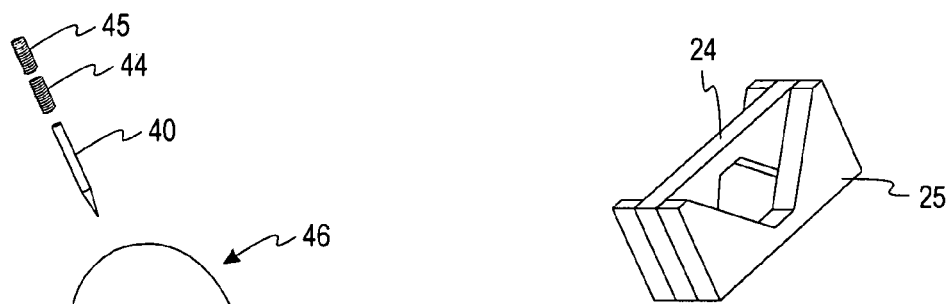
Figure 3:
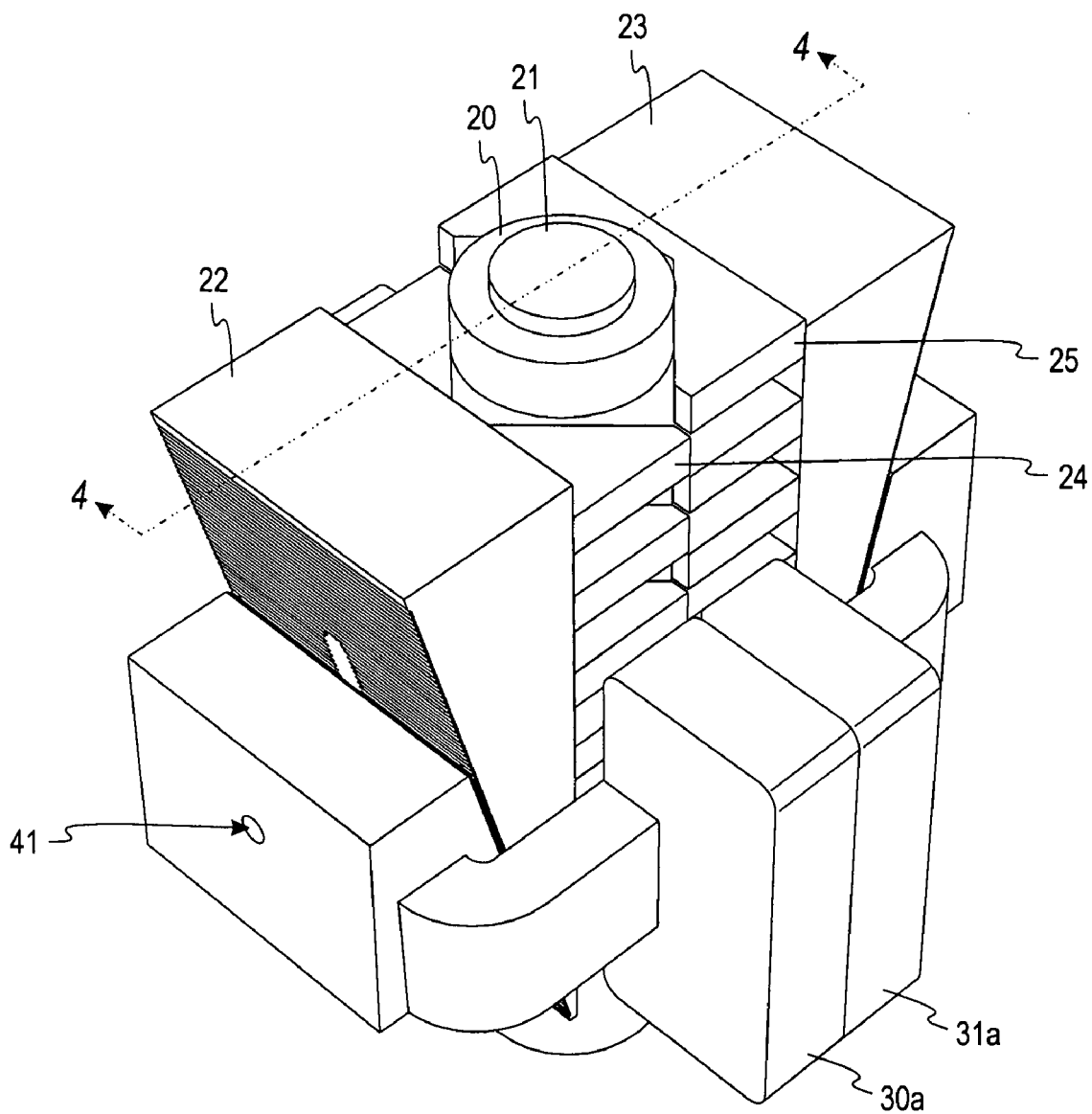
FIG. 3 is a further enlarged perspective view of one of the clamp-on current and voltage modules shown in FIG. 1.
Figure 4:
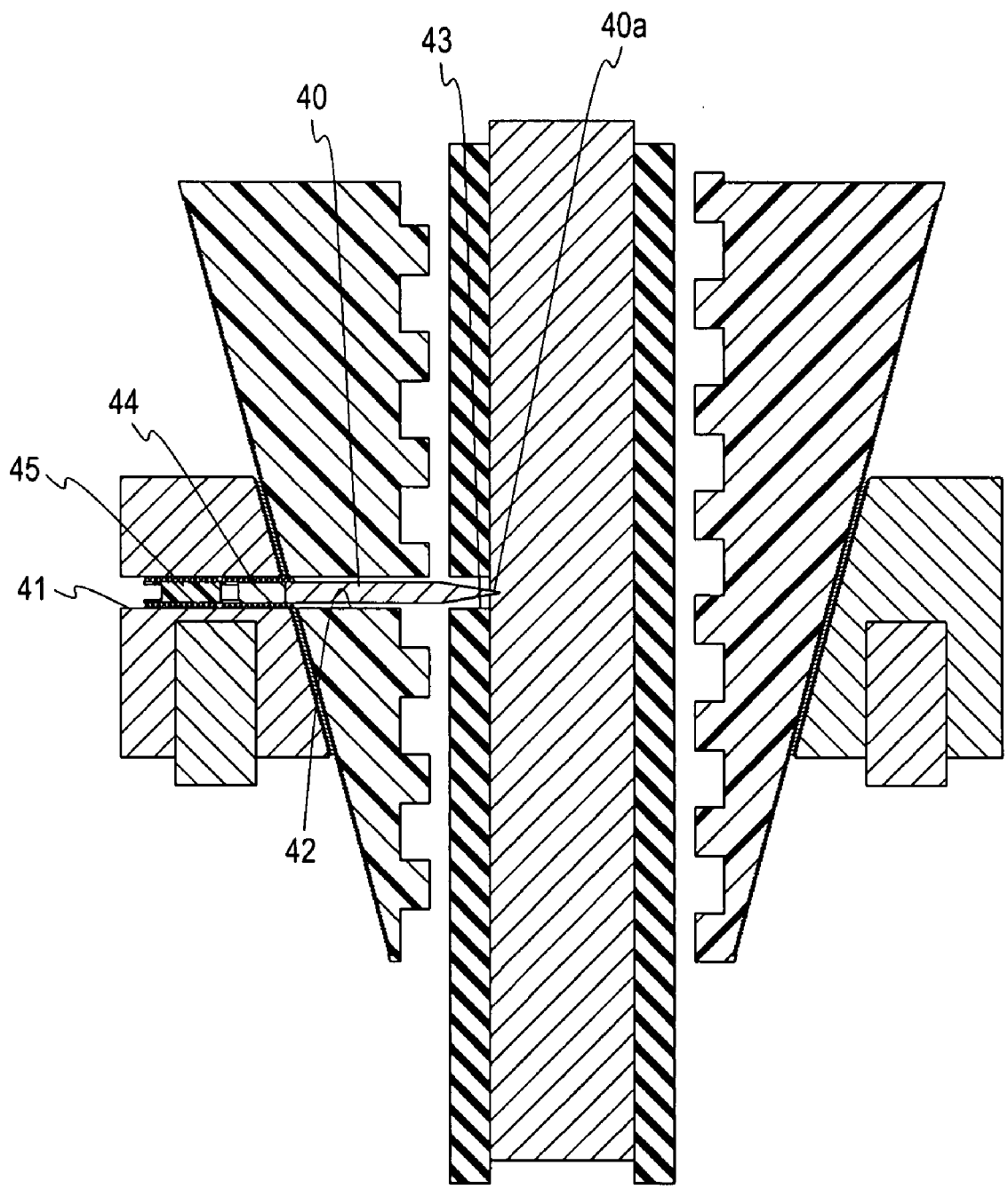
FIG. 4 is a section taken along line 4-4 in FIG. 3.

The various components of each of the CVM's shown in FIG. 1 can be seen more clearly in FIGS. 2-4. The insulation 20 surrounding a conductor 21 is gripped on opposite sides by a pair of clamping elements 22 and 23 that form interdigital sets of spaced ribs 24 and 25, respectively, on their opposed inner surfaces. All the interdigital ribs 24 and 25 are notched to form a pair of opposed, generally V-shaped channels 26 and 27 extending parallel to the longitudinal axis of the conductor 21. When the two clamping elements 22 and 23 are pressed against opposite sides of the insulation 20, the outer portions of the interdigital ribs 24 and 25 slide between each other so that the narrow surfaces of the inner portions of the ribs 24 and 25 bite into the insulation. After the two sets of ribs have been pressed firmly against the insulation, there can be no relative movement between the insulated conductor and the two clamping elements as long as the clamping elements continue to be pressed firmly against opposite sides of the insulated conductor.

The V shape of the channels 26 and 27 enables the clamping elements 22 and 23 to accommodate a wide range of different diameters of insulated conductors. Specifically, the minimum diameter that can be accommodated by the clamping elements 22 and 23 can accommodate is a diameter equal to the smallest transverse dimension of the hexagonal opening 28 formed when the two sets of ribs 24 and 25 fully overlap each other, as depicted in FIG. 2b.

The opposed clamping elements 22 and 23 are pressed against opposite sides of the insulated conductor by two mating C-shaped members 30 and 31 having respective pads 30a,b and 31a,b at their open ends. Each C-shaped member forms half of the core 32 of a current transformer, so that when the two mating pairs of pads 30a, 31a and 30b, 31b are pressed against each other, a 360° core 32 surrounds the insulated conductor. The two clamping members are held together by two captive screws, one on each pad.

It will be noted that the two C-shaped members 30 and 31 have a fixed size, although the space between the two clamping elements 22 and 23 can vary to accommodate different diameters of insulated conductors. The fixed size of the members 30 and 31 is accommodated by providing an angled interface between each of the members 30 and 31 and the opposed clamping element 22 or 23, as can be seen most clearly in FIG. 4. The C-shaped member 30 forms an angled inner surface 32 that engages a similarly angled, but longer, surface 22a on the clamping element 22. Similarly, the C-shaped member 31 forms an angled inner surface 33 that engages a similarly angled, but longer, surface 23a on the clamping element 23. It will be noted that as the radial spacing between the two clamping elements 22 and 23 is varied, the surfaces 22a and 23a can remain engaged with the opposed surfaces 32 and 33 of the C-shaped members by simply adjusting the relative longitudinal positions of the members 30 and 31 with respect to the clamping elements 22 and 23. Thus, regardless of the radial spacing between the clamping elements 22 and 23, the pads of the members 30 and 31 can tightly engage each other, and at the same time the interface surfaces 22a, 32 and 23a, 33 can also tightly engage each other.

When electrical current is flowing in the power conductor 21, current flow is induced in a winding of the current transformer, as is well known in this industry. The current flow in the transformer winding is used as the current signal that is processed and ultimately fed to a processor in the power monitoring system.

A voltage signal is also produced, by engaging the power conductor 21 with a conductive radial probe 40 (see FIGS. 2 and 4). The probe 40 is passed through registered holes 41, 42 and 43 formed in the C-shaped member 30, the adjacent clamping element 22, and the insulation on the conductor 21. A sharp point 40a on the end of the probe 40 enable the probe to slightly penetrate the metal of the conductor 21 to ensure good electrical contact. The probe 40 is forced against the conductor 21 by a metal screw 44 threaded into the outermost hole 41 (formed in the C-shaped member 30), which is followed by a non-conductive screw 45 made of plastic, ceramic or the like so that the voltage on the probe 40 and metal screw 44 is not exposed on the exterior of the CVM.

Figure 5:
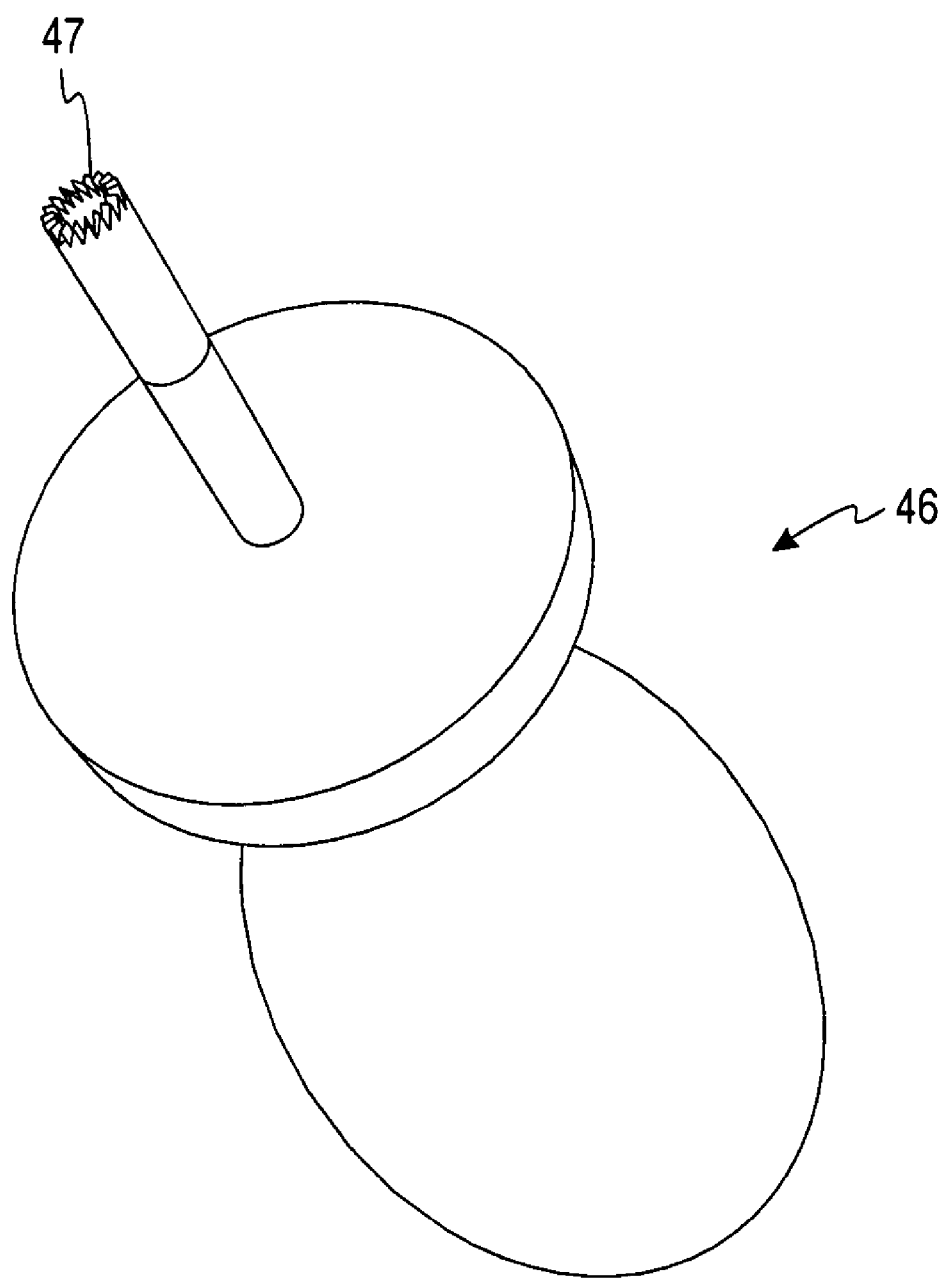
FIG. 5 is a further enlarged perspective view of the tool shown in FIG. 2.

FIG. 5 illustrates a tool 46 for use in forming the hole 43 in the insulator on the power conductor 21. The tool 46 is inserted through the registered holes 41 and 42 to engage the insulator, and then rotated so that serrated teeth 47 on the end of the tool cut through the insulation.

Figure 6:
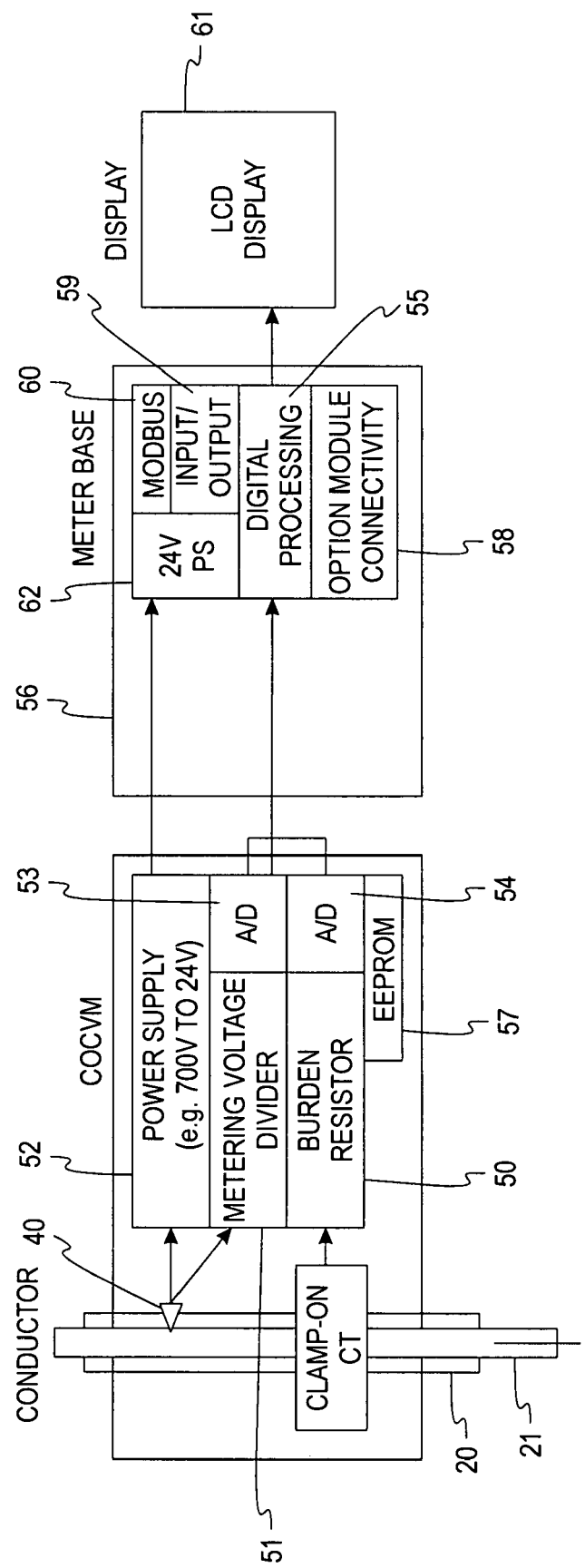
FIG. 6 is a block diagram of the internal architecture of one particular embodiment of the current and voltage modules shown in FIGS. 1-4.

FIG. 6 illustrates the circuitry contained within the CVM. This circuitry is provided by one or more small printed circuit ("PC") boards mounted inside one or both of the C-shaped members 30 and 31 that contain the core of the current transformer. Specifically, the PC board(s) may be embedded in one or more of the pads 30a,b and 31a,b formed by the members 30 and 31, or in one or both of the central portions of those members that form the angled surfaces 32 and 33. As shown in FIG. 6, the built-in circuitry includes a burden resistor 50 for the current transformer, a metering voltage divider 51 for the voltage signal from the voltage sensing probe 40, a power supply 52 that converts the AC line voltage to a 24-volt DC supply for the power monitoring system, and a pair of analog-to-digital ("A/D") converters 53 and 54 that convert the analog current and voltage signals to digital signals that can be fed to a downstream processor 55 in a meter base 56. The CVM also contains a memory device, such as the EEPROM 57 depicted in FIG. 6, for storing data identifying the CVM and its electrical characteristics. The circuitry may optionally include signal conditioning circuits.

The meter base 56 contains the processor 55 that receives the current and voltage signals from the CVM via serial bus 57 and generates the outputs required for desired displays, reports and remote communications. The processor 55 may also receive input signals from option modules via connecting circuitry 58, and may receive and transmit communication signals via an I/O port 59 coupled to a standard communication bus such as a MODBUS 60 for communicating with remote equipment, such as work stations networked with the power monitoring equipment. The processor 55 produces output signals representing data to be displayed on a display module 61. A DC power supply 62 receives low voltage DC power (e.g. 24-volt DC) from the power supply in the CVM or from an external source and generates the different voltage levels needed for the processor and other meter base components.

With the illustrative CVM, no shorting blocks or fuses need be employed. The CVM can be used with power conductors carrying currents in the range of 100 to 630 amperes, and voltages ranging up to 770 volts.

The CVM of FIGS. 1-6 can be used in the initial installation of power monitoring systems or to retrofit previously installed systems. The CVM integrates multiple components into single units to facilitate installation and reduce the number of parts to be handled and installed. Multiple CVM's can be easily daisy chained for multi-phase applications. The CVM significantly reduces the size of the overall monitoring system, the number of connections required, and the complexity of the installation. A single connector can be employed to furnish all the input signals required by the power monitoring system, as well as control power for the system. The CVM is a double-isolated device with low voltage output which makes it a self-contained, safe solution for sensing both current and voltage. The CVM also provides a reduced footprint, reduced installation time, reduced wiring errors, improved flexibility of installation, increased simplicity of installation, improved safety, improved total system accuracy, and reduction of total solution cost versus alternative solutions.

Figure 7:
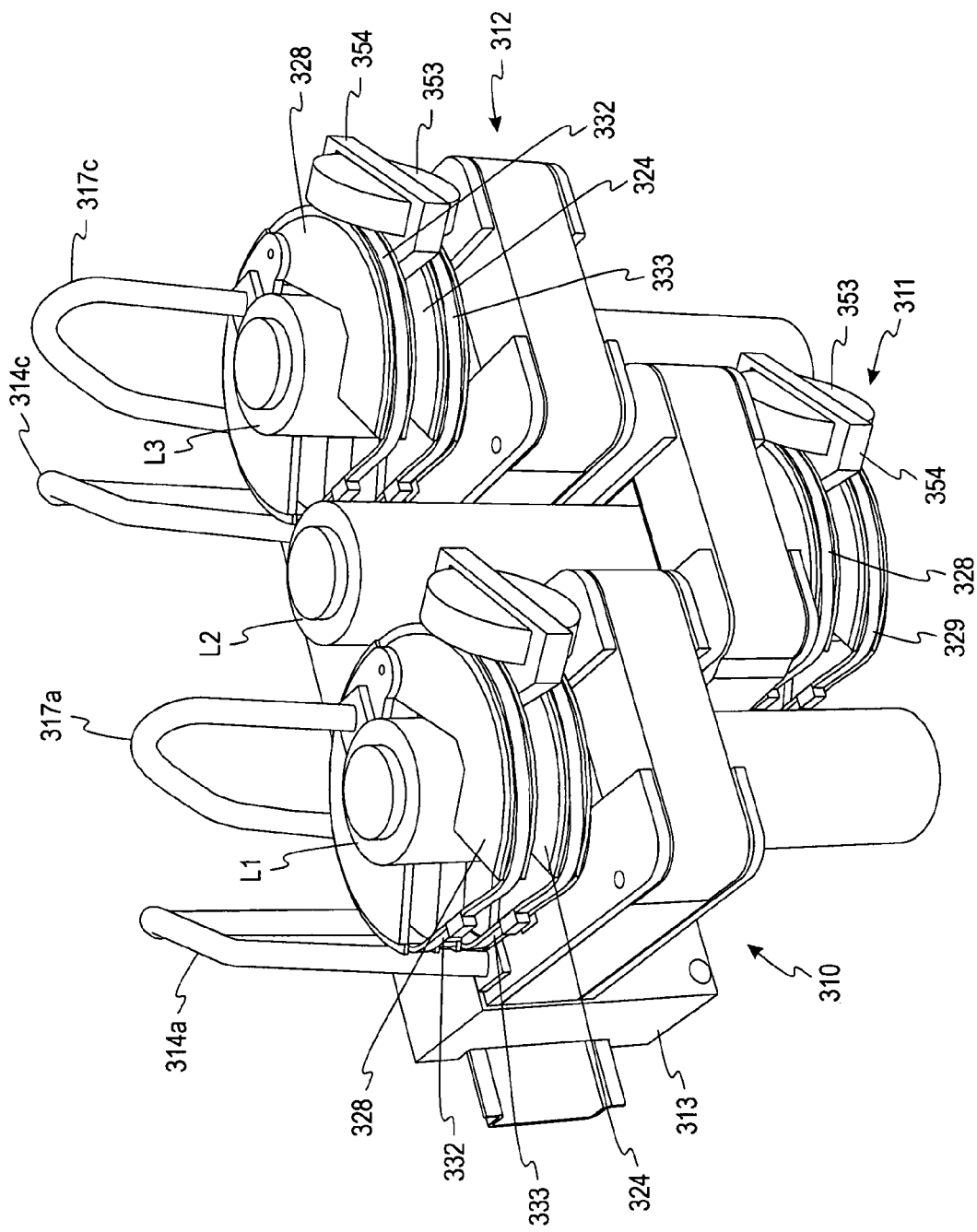
FIG. 7 is a perspective view of a set of three clamp-on current and voltage modules installed on the three conductors of a three-phase power distribution system.

A modified embodiment of a CVM is illustrated in FIGS. 7-14. In FIG. 7, a set of three identical CVM's 310, 311 and 312 are coupled to the three insulated conductors L1, L2 and L3 of a three-phase power distribution system. Each CVM 310-312 is clamped tightly around the insulation of one of the power conductors L1-L3 so that any current flowing in that conductor is sensed by the CVM, which produces a corresponding current signal for use in a power monitoring system. In addition, each CVM also includes a voltage sensor that produces a corresponding voltage signal for use in the power monitoring system.

The analog output signals from both the current sensors and the voltage sensors in the CVM are converted to a digital signal in analog-to-digital ("A/D") converters built into the CVM's 310-312. The resulting digital output signals from the A/D converters can be fed to a processor that executes a series of calculations designed to monitor multiple characteristics of the power being distributed via the conductors L1-L3. The CVM also contains built-in signal conditioning circuitry, between the sensors and the A/D converters, to condition the sensor output signals for presentation to the A/D converters.

When more than one CVM is used, as in the application illustrated in FIG. 7, the digital outputs of the multiple CVM's may be connected to a sensor base module 313 (power supply) or daisy-chained so that those outputs are communicated to the downstream processor serially in a single communication channel. In the illustrative embodiment of FIG. 7, the three CVM's 310-312 are daisy chained by six cable segments, three segments 314a-c for the current channels and three segments 317a-317c for the voltage channels cable segments, with the final segment 317c being coupled to the downstream processor, or to a module containing that processor.

As will become apparent from the following description, the illustrated CVM's offer a number of advantages over CVM's that have been previously used or proposed, including ease and flexibility of installation, a reduced footprint, minimal wiring requirements, and a reduced number of parts.

Figure 8:
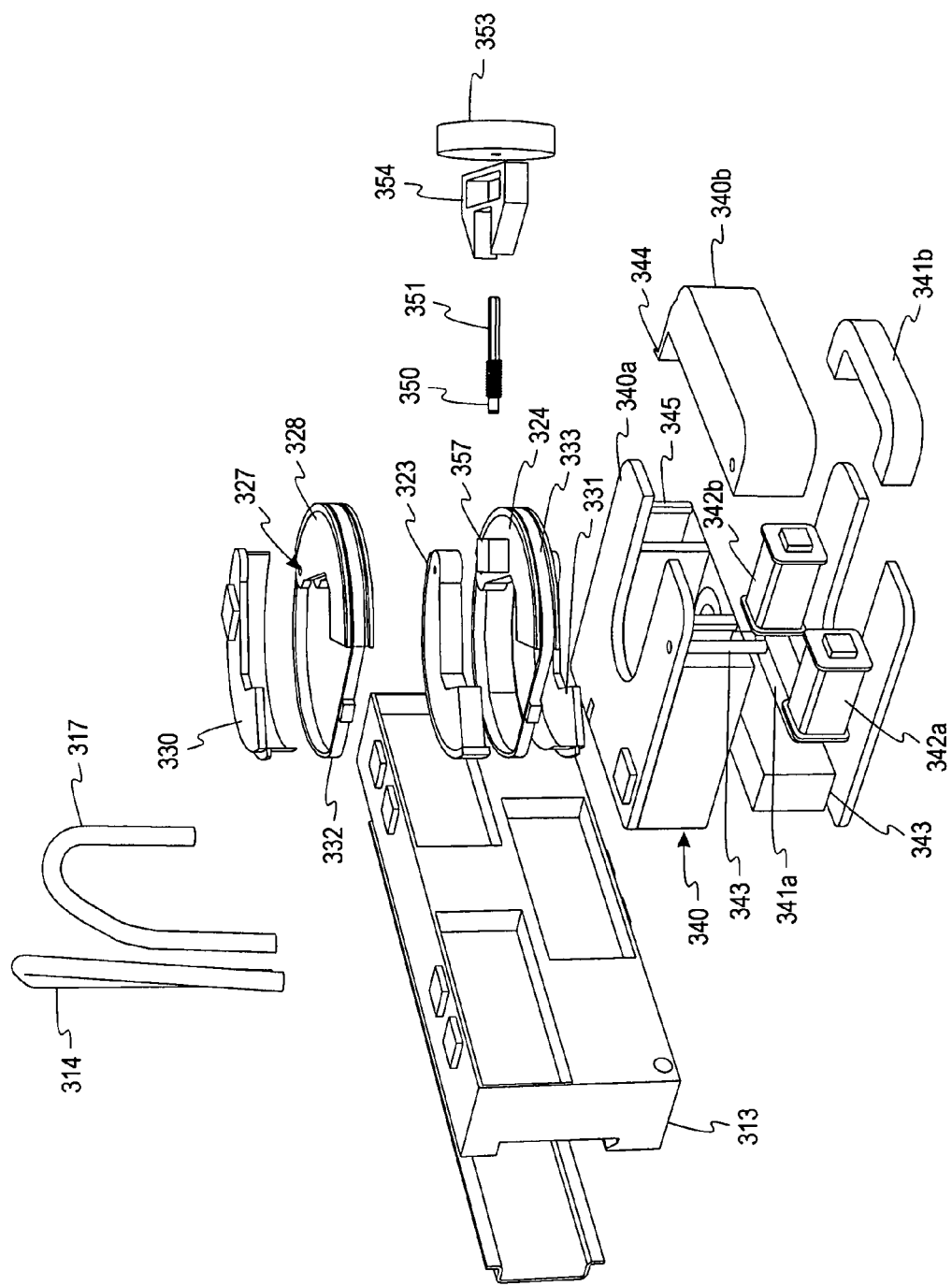
FIG. 8 is an enlarged, exploded perspective view of one of the clamp-on current and voltage modules shown in FIG. 7.
Figure 9:
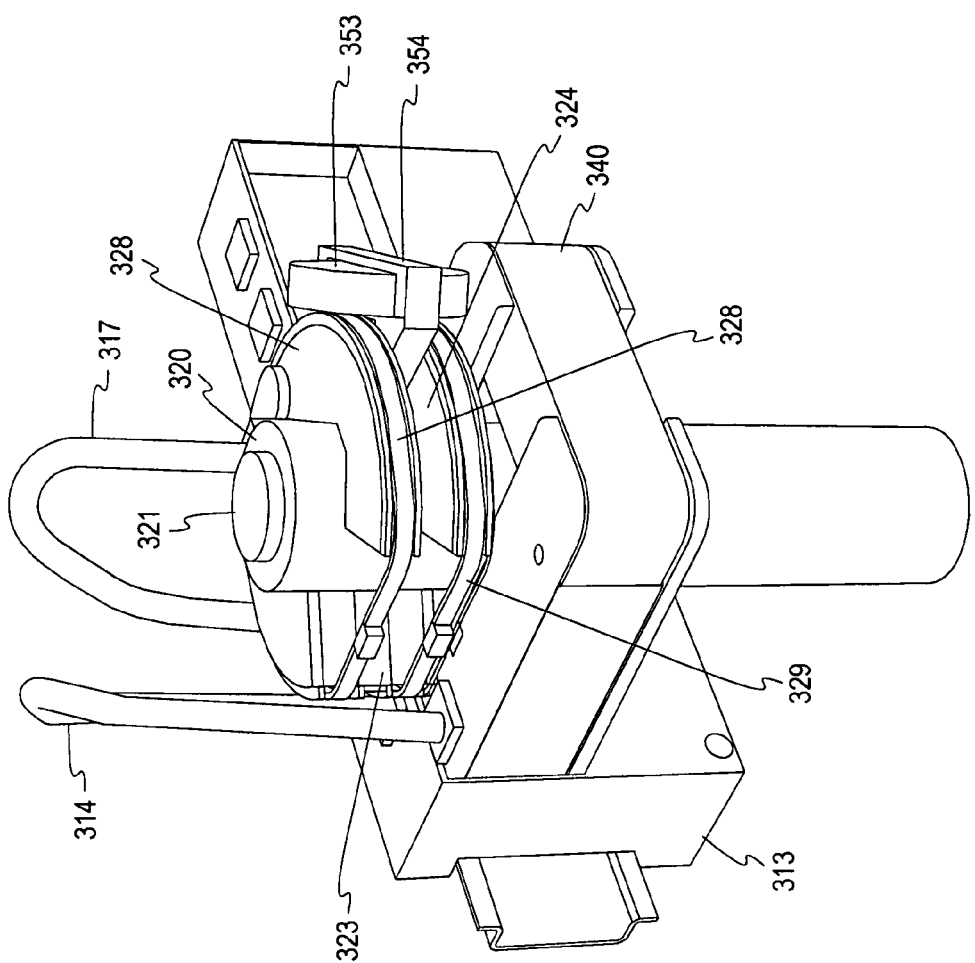
FIG. 9 is a further enlarged perspective view of one of the clamp-on current and voltage modules shown in FIG. 7 with the power supply module.
Figure 11:
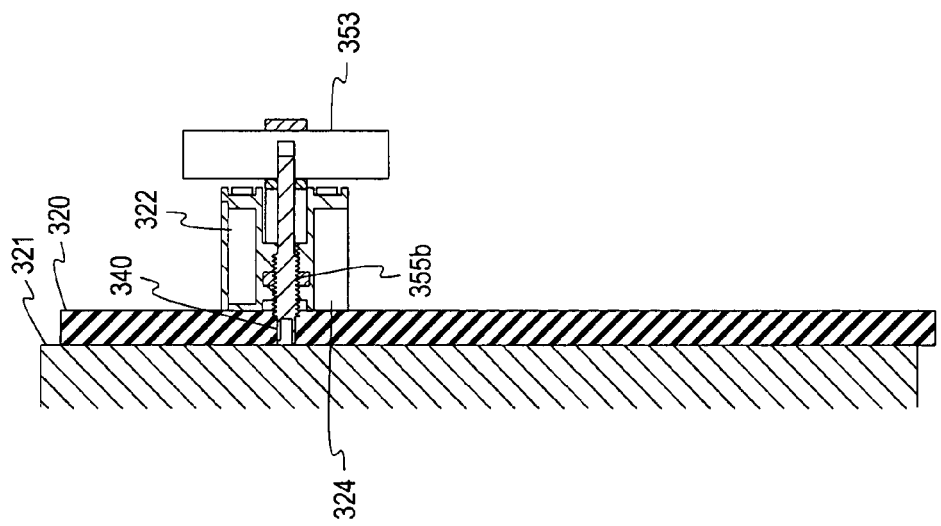
FIG. 11 is a section taken along line 11-11 in FIG. 10.
Figure 10:
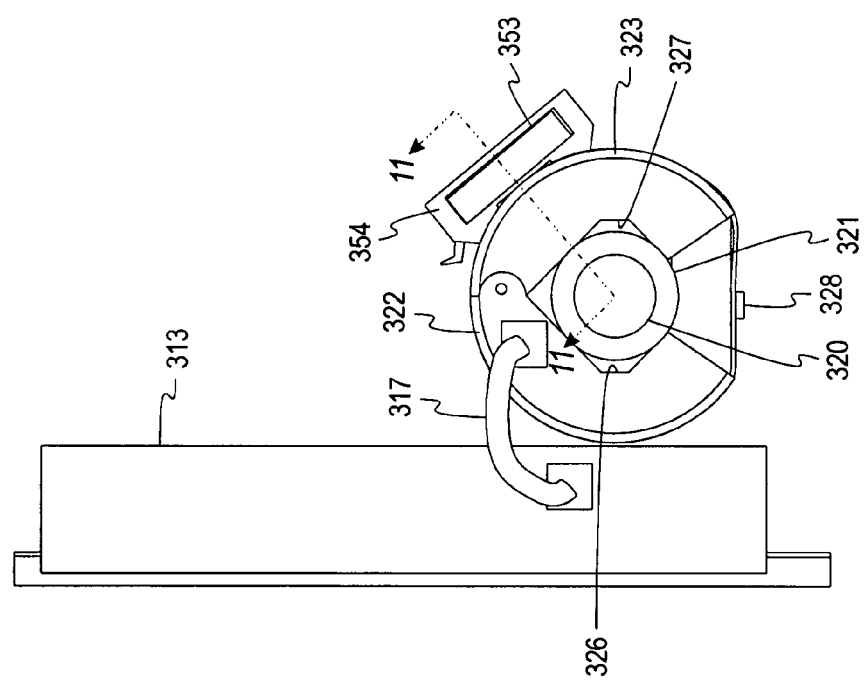
FIG. 10 is a top plan view of the modules shown in FIG. 9.
Figure 12:
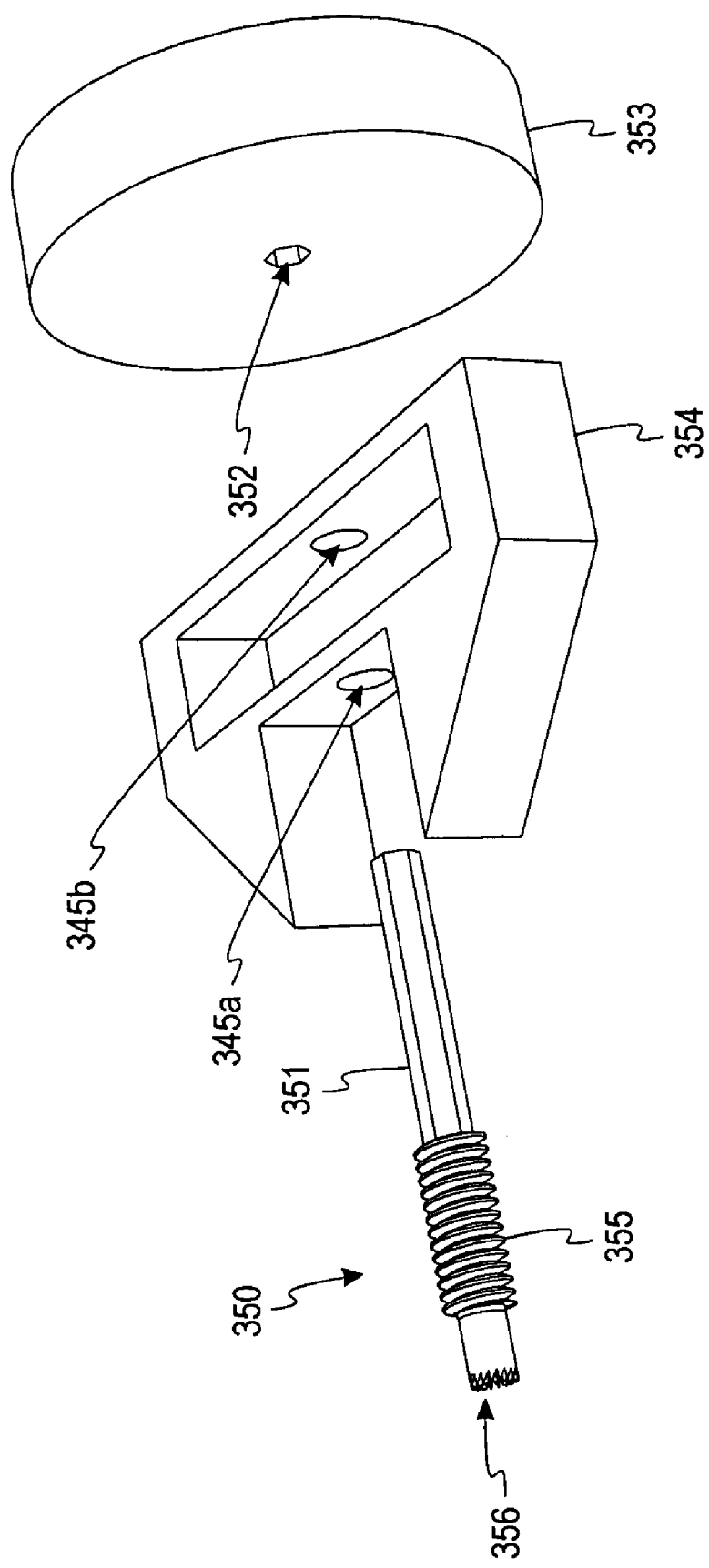
FIG. 12 is a further enlarged perspective view of the voltage sensor shown in FIG. 11.

The various components of each of the CVM's shown in FIG. 7 can be seen more clearly in FIGS. 8-10. The insulation 320 surrounding a conductor 321 is gripped on opposite sides by a clamping assembly that includes clamping elements 322, 323 and 324 that form opposed notches on their opposed inner surfaces. When the clamping elements 322-324 are pressed against opposite sides of the insulation 320, the opposed inner edges of the clamping elements bite into the insulation. After the two sets of ribs have been pressed firmly against the insulation, there can be no relative movement between the insulated conductor and the clamping elements as long as the clamping elements continue to be pressed firmly against opposite sides of the insulated conductor.

Figure 13C:
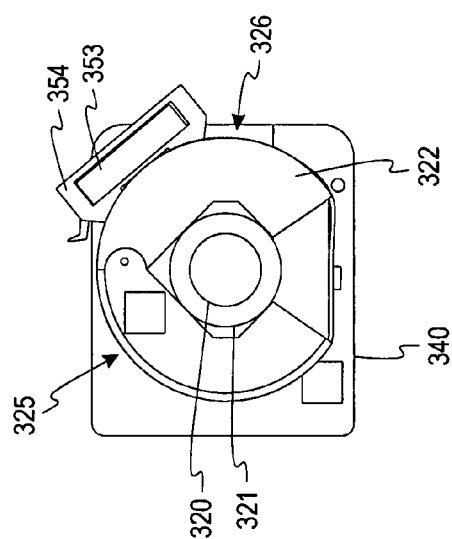
FIG. 13 is a top plan view of one clamp-on current and voltage module showing different degrees of openings (a—installation, b—minimum conductor diameter, c—maximum conductor diameter).
Figure 13B:
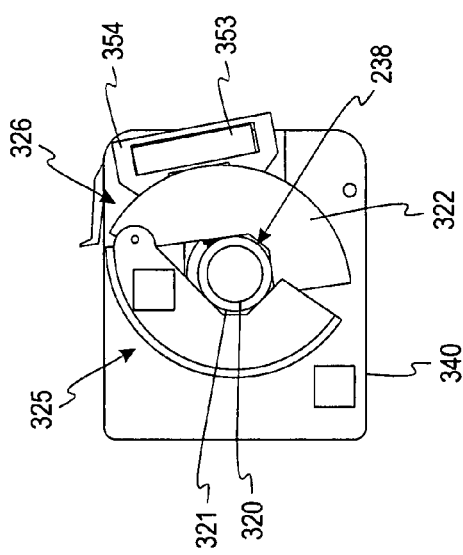
Figure 13A:
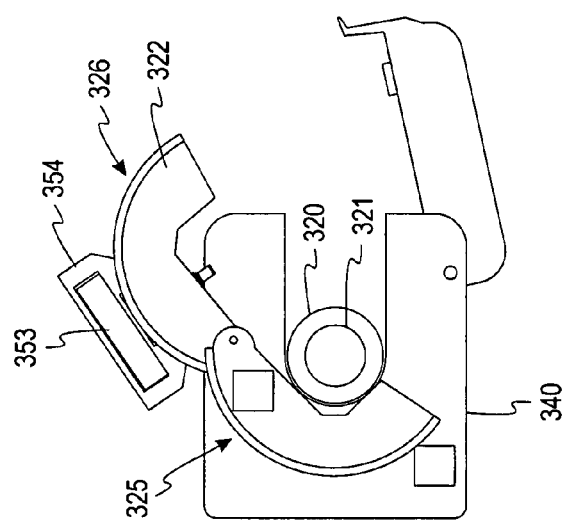
Figure 14:
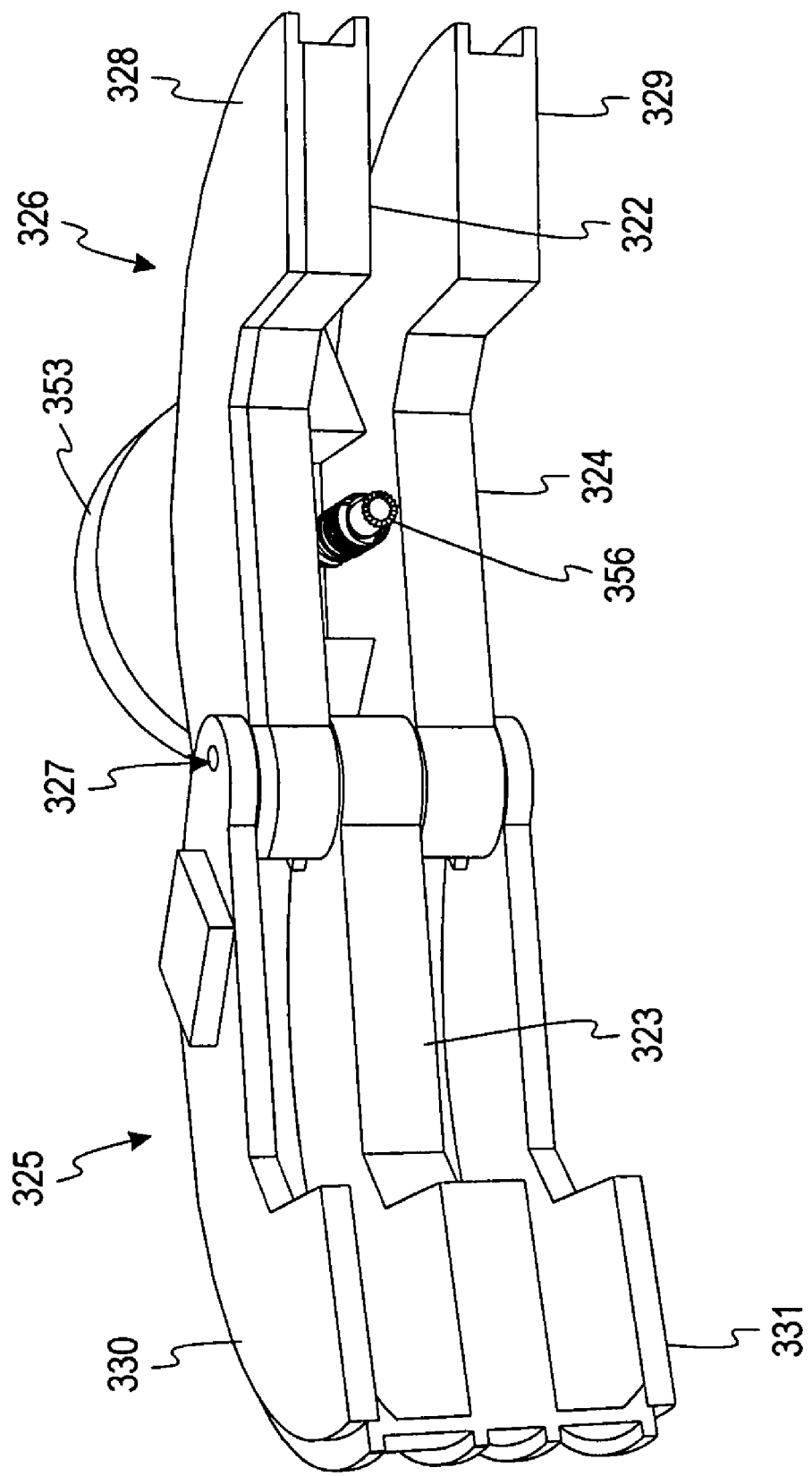
FIG. 14 is an enlarged perspective view of the clamping assembly and voltage probe in the CVM of FIGS. 7-13.

The individual components of the clamping assembly are shown in more detail in FIG. 14. Two clamping sub-assemblies 325 and 326 are mounted for pivoting movement about a common axis defined by a shaft 327. The right-hand sub-assembly 326, as viewed in FIG. 14, includes the two clamping elements 322 and 324, the outer surfaces of which are covered by caps 328 and 329. The left-hand sub-assembly 325, as viewed in FIG. 14, includes the third clamping element 323 and a pair of end plates 330 and 331. It can be seen that the clamping element 323 is positioned between the other two clamping elements 322 and 324 so that the left and right elements have an interdigital relationship that enables them to overlap each other as they are pivoted toward each other, around the shaft 327. As can be seen in FIGS. 13a-13c, the generally V-shaped notches formed by the inner surfaces of the clamping elements 322-324, combined with the pivoting movement and interdigital relationship of the clamping elements, enables the clamping assembly to accommodate a wide range of different diameters of insulated conductors.

FIG. 13a shows two sub-assemblies 325 and 326 wide open with a medium-diameter power conductor 321 ready to be engaged, FIG. 13b shows the sub-assemblies slightly overlapping to engage a relatively small-diameter power conductor 321, and FIG. 13c shows the sub-assemblies in an intermediate position engaging a larger-diameter power conductor 321.

Clamping pressure is applied to the two sub-assemblies 325 and 326, and thus to the clamping elements 322-324, by a pair of wire ties 332 and 333 extending around both sub-assemblies. These wire ties 332 and 333 are applied after the sub-assemblies 325 and 326 have been pivoted into engagement with the power conductor, and are drawn tightly around the sub-assemblies to draw the clamping elements 322-324 into tight engagement with the insulation 320 of the power conductor. This captures the insulated conductor 320 firmly between the clamping elements.

In reference to FIG. 8, the current transformer for the CVM of FIGS. 7-13 is contained in a housing 340 that also supports the clamping assembly. The current transformer includes a core 341 formed by two C-shaped core sections 341a and 341b and having two windings 342a and 342b wound around opposite legs of the core. The windings 342a,b are electrically connected to circuitry on a PC board 343 in the rear of the housing 340. When electrical current is flowing in the power conductor 321, current flow is induced the windings 342a,b, which is the current signal that is processed and ultimately fed to a processor in the power monitoring system.

The housing 340 is formed of two sections 340a and 340b which are hinged together by a pin 343. A hook 344 on the free end of the section 340b snaps over an internal flange 345 on the section 340a when the section 340b is pivoted to its closed position.

A voltage signal is also produced, by engaging the power conductor 321 with a conductive probe 350 (see FIGS. 8, 11, 12 and 14). The probe 350 includes a hexagonal shank 351 that fits into a mating socket 352 in a thumb wheel 353 that fits into a mounting bracket 354. The shank 351 extends through a pair of holes 354a and 354b in the bracket 354 to hold the thumb wheel 353 in place. The bracket fits between the two clamping elements 322 and 324 and mates with a block 357 mounted on the surface of the clamping element 324. When the thumb wheel 353 is rotated, it rotates the probe 350 and thus engages threads 355 of the probe 350 with mating threads in a hole extending through the block 357. The threads 355 cause the probe 350 to be advanced into engagement with the insulation 321 on the power conductor 320. The inboard end 356 of the probe 350 forms multiple teeth that cut through the insulation 321 as the probe is rotated and that bite into the metal conductor 320 when the insulation has been penetrated.

The thumb wheel 353 is sufficiently thick to permit sufficient radial movement of the probe to penetrate the insulation 321 without escaping from the hexagonal socket 352 in the thumb wheel. This thumb wheel is preferably made of a non-conductive material, such as glass-reinforced plastic, ceramic or the like, so that the voltage on the probe 340 is not exposed on the exterior of the CVM. The voltage signal is carried from the sensor to voltage-conditioning circuitry on the PC board 343 through a conductive thread (or nut) (355b of FIG. 11) and a wire inserted in the non-conductive CT enclosure.

The circuitry contained within the CVM of FIGS. 7-15 is the same as that described above in connection with FIG. 6. The CVM provided can be used in the initial installation of power monitoring systems or to retrofit previously installed systems. The CVM integrates multiple components into single units to facilitate installation and reduce the number of parts to be handled and installed. Multiple CVM's can be easily daisy chained for multi-phase applications. The CVM significantly reduces the size of the overall monitoring system, the number of connections required, and the complexity of the installation. A single connector can be employed to furnish all the input signals required by the power monitoring system, as well as control power for the system. The CVM is a double-isolated device with low voltage output which makes it a self-contained, safe solution for sensing both current and voltage. The CVM also provides a reduced footprint, reduced installation time, improved flexibility of installation, increased simplicity of installation, improved safety, improved total system accuracy, and reduction of total solution cost versus alternative solutions.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. An electrical power monitoring system that monitors characteristics of power distributed through one or more power conductors, said system comprising
multiple clamp-on current and voltage modules each of which includes
a current transformer having a core divided into at least two parts so that the core can be installed around a power conductor without cutting the conductor, said transformer producing a current signal corresponding to current passing through said power conductor,
a pair of clamping elements adapted to fit between said current transformer core and said power conductor, on opposite sides of said conductor, for gripping said conductor, said transformer core parts and said clamping elements having engaging surfaces that prevent relative movement between said engaging surfaces in a direction parallel to the axis of said power conductor when said transformer core parts are pressed against said clamping elements in a direction transverse to the axis of said power conductor,
a voltage sensor for making electrical contact with said power conductor and producing a voltage signal corresponding to the voltage on said power conductor, and
an enclosure for said current transformer, and electrical circuitry in said enclosure for receiving said current and voltage signals and converting those signals to digital signals, and
a stationary base module connected to said enclosures of said multiple clamp-on current and voltage modules for permanently supporting said enclosures and said current and voltage modules therein independently of said power conductor.

2. The clamp-on current and voltage module of claim 1 which includes a voltage probe extending through one of said clamping elements, in a direction transverse to the axis of said power conductor, and making electrical contact with said power conductor for producing a voltage signal corresponding to the voltage on said power conductor.

3. The clamp-on current and voltage module of claim 1 in which at least one of said transformer core parts includes a winding on said core.

4. The clamp-on current and voltage module of claim 1 which includes electrical circuitry integrated into at least one of said transformer core parts for receiving said current and voltage signals and converting those signals to digital signals.

5. The clamp-on current and voltage module of claim 4 wherein said circuitry includes a burden resistor for said current transformer and a voltage divider for said voltage sensor.

6. The clamp-on current and voltage module of claim 4 wherein said circuitry includes a power supply circuit for converting AC line voltage from said power conductor to a reduced DC control voltage for the power monitoring system.

7. An electrical power monitoring system that monitors characteristics of power distributed through one or more power conductors, said system comprising
multiple clamp-on current and voltage modules each of which includes
a current transformer having a core divided into at least two parts so that the core can be installed around a power conductor without cutting the conductor, said transformer producing a current signal corresponding to current passing through said power conductor,
a pair of clamping elements adapted to fit between said current transformer core and said power conductor, on opposite sides of said conductor, for gripping said conductor, said transformer core parts and said clamping elements having engaging surfaces that prevent relative movement between said engaging surfaces in a direction parallel to the axis of said power conductor when said transformer core parts are pressed against said clamping elements in a direction transverse to the axis of said power conductor,
a voltage sensor for making electrical contact with said power conductor and producing a voltage signal corresponding to the voltage on said power conductor, and
an enclosure for said current transformer, and electrical circuitry in said enclosure for receiving said current and voltage signals and converting those signals to digital signals, and
a base module connected to said enclosures of said multiple clamp-on current and voltage modules for supporting said enclosures and said current and voltage modules therein,
the surfaces of said clamping elements that grip opposite sides of said power conductor form interdigital ribs that bite into insulation on said power conductor when said clamping elements are pressed against said insulation on opposite sides of said conductor.

8. An electrical power monitoring system that monitors characteristics of power distributed through one or more power conductors, said system comprising
multiple clamp-on current and voltage modules each of which includes
a current transformer having a core divided into at least two parts so that the core can be installed around a power conductor without cutting the conductor, said transformer producing a current signal corresponding to current passing through said power conductor,
a pair of clamping elements adapted to fit between said current transformer core and said power conductor, on opposite sides of said conductor, for gripping said conductor, said transformer core parts and said clamping elements having engaging surfaces that prevent relative movement between said engaging surfaces in a direction parallel to the axis of said power conductor when said transformer core parts are pressed against said clamping elements in a direction transverse to the axis of said power conductor,
a voltage sensor for making electrical contact with said power conductor and producing a voltage signal corresponding to the voltage on said power conductor, and
an enclosure for said current transformer, and electrical circuitry in said enclosure for receiving said current and voltage signals and converting those signals to digital signals, and
a base module connected to said enclosures of said multiple clamp-on current and voltage modules for supporting said enclosures and said current and voltage modules therein,
said engaging surfaces of said clamping elements and said transformer core parts are angled and are longer on said clamping elements than on said transformer core parts, to accommodate different spacings between said clamping elements without changing the size of said transformer core parts, by adjustment of the longitudinal positions of said transformer core parts relative to said clamping elements.

9. A method of producing current and voltage signals for an electrical power monitoring system that monitors characteristics of power distributed through one or more power conductors, said method comprising
gripping a power conductor between a pair of clamping elements on opposite sides of said conductor,
installing a current transformer core divided into at least two parts against the outer surfaces of said clamping elements on opposite sides of said power conductor, said transformer producing a current signal corresponding to current passing through said power conductor, said transformer core parts and said clamping elements having engaging surfaces that prevent relative movement between said engaging surfaces in a direction parallel to the axis of said power conductor when said transformer core parts are pressed against said clamping elements in a direction transverse to the axis of said power conductor, and
making electrical contacting said power conductor with a voltage sensor to produce a voltage signal corresponding to the voltage on said power conductor,
said current transformer and voltage sensor being contained in an enclosure that also contains electrical circuitry receiving said current and voltage signals and converting those signals to digital signals, and said enclosure being connected to a stationary base module for permanently supporting said enclosure and said current transformer and voltage sensor within said enclosure independently of said power conductor.

10. The method of claim 9 which includes a voltage probe extending through one of said clamping elements, in a direction transverse to the axis of said power conductor, and making electrical contact with said power conductor for producing a voltage signal corresponding to the voltage on said power conductor.

11. The method of claim 9 in which at least one of said transformer core parts includes a winding on said core.

12. The method of claim 9 in which said current and voltage signals are convened to digital signals in electrical circuitry integrated into at least one of said transformer core parts.

13. The method of claim 12 wherein said circuitry includes a burden resistor for said current transformer and a voltage divider for said voltage sensor.

14. The method of claim 9 in which said AC line voltage from said power conductor is converted to a reduced DC control voltage for the power monitoring system, in electrical circuitry integrated into at least one of said transformer core parts.

15. A method of producing current and voltage signals for an electrical power monitoring system that monitors characteristics of power distributed through one or more power conductors, said method comprising
gripping a power conductor between a pair of clamping elements on opposite sides of said conductor,
installing a current transformer core divided into at least two pans against the outer surfaces of said clamping elements on opposite sides of said power conductor, said transformer producing a current signal corresponding to current passing through said power conductor, said transformer core parts and said clamping elements having engaging surfaces that prevent relative movement between said engaging surfaces in a direction parallel to the axis of said power conductor when said transformer core parts are pressed against said clamping elements in a direction transverse to the axis of said power conductor, and
making electrical contacting said power conductor with a voltage sensor to produce a voltage signal corresponding to the voltage on said power conductor,
said current transformer and voltage sensor being contained in an enclosure that also contains electrical circuitry receiving said current and voltage signals and converting those signals to digital signals, and said enclosure being connected to a base module for supporting said enclosure and said current transformer and voltage sensor within said enclosure,
the surfaces of said clamping elements that grip opposite sides of said power conductor form interdigital ribs that bite into insulation on said power conductor when said clamping elements are pressed against said insulation on opposite sides of said conductor.

16. A method of producing current and voltage signals for an electrical power monitoring system that monitors characteristics of power distributed through one or more power conductors, said method comprising
gripping a power conductor between a pair of clamping elements on opposite sides of said conductor,
installing a current transformer core divided into at least two parts against the outer surfaces of said clamping elements on opposite sides of said power conductor, said transformer producing a current signal corresponding to current passing through said power conductor, said transformer core parts and said clamping elements having engaging surfaces that prevent relative movement between said engaging surfaces in a direction parallel to the axis of said power conductor when said transformer core parts are pressed against said clamping elements in a direction transverse to the axis of said power conductor, and
making electrical contacting said power conductor with a voltage sensor to produce a voltage signal corresponding to the voltage on said power conductor,
said current transformer and voltage sensor being contained in an enclosure that also contains electrical circuitry receiving said current and voltage signals and converting those signals to digital signals, and said enclosure being connected to a base module for supporting said enclosure and said current transformer and voltage sensor within said enclosure,
different spacings between said clamping elements are accommodated without changing the size of said transformer core parts, by providing said clamping elements and said transformer core parts with engaging surfaces that are angled and that are longer on said clamping elements than on said transformer core parts, and adjusting the longitudinal positions of said transformer core parts relative to said clamping elements to accommodate different spacings between said clamping elements.

17. A clamp-on current and voltage module for an electrical power monitoring system that monitors characteristics of power distributed through one or more power conductors, said module comprising
a current transformer having a core divided into at least two parts so that the core can be installed around a power conductor without cutting the conductor, said transformer producing a current signal corresponding to current passing through said power conductor,
a pair of clamping elements adapted to fit on opposite sides of said conductor, for gripping said conductor, and having engaging surfaces that prevent relative movement between said current transformer and said power conductor in a direction parallel to the axis of said power conductor when said transformer clamping elements are pressed in a direction transverse to the axis of said power conductor, and
a voltage sensor for making electrical contact with said power conductor and producing a voltage signal corresponding to the voltage on said power conductor,
wherein said engaging surfaces of said clamping elements and said transformer core parts are angled and are longer on said clamping elements than on said transformer core parts, to accommodate different spacings between said clamping elements without changing the size of said transformer core parts, by adjustment of the longitudinal positions of said transformer core parts relative to said clamping elements.

18. The clamp-on current and voltage module of claim 17 which includes a voltage probe extending through one of said clamping elements, in a direction transverse to the axis of said power conductor, and making electrical contact with said power conductor for producing a voltage signal corresponding to the voltage on said power conductor.

19. The clamp-on current and voltage module of claim 17 in which at least one of said transformer core parts includes at least one winding on said core.

20. The clamp-on current and voltage module of claim 17 which includes an enclosure for said current transformer, and electrical circuitry in said enclosure for receiving said current and voltage signals and converting those signals to digital signals.

21. The clamp-on current and voltage module of claim 20 wherein said circuitry includes a burden resistor for said current transformer and a voltage divider for said voltage sensor.

22. The clamp-on current and voltage module of claim 20 wherein said circuitry includes a power supply circuit for converting AC line voltage from said power conductor to a reduced DC control voltage for the power monitoring system.

23. The clamp-on current and voltage module of claim 17 in which the surfaces of said clamping elements that grip opposite sides of said power conductor form interdigital elements that bite into insulation on said power conductor when said clamping elements are pressed against said insulation on opposite sides of said conductor.

24. The clamp-on current and voltage module of claim 17 wherein said clamping elements are mounted for pivoting movement to accommodate different sizes of power conductors by changing the angle between different ones of said clamping elements.

25. A method of producing current and voltage signals for an electrical power monitoring system that monitors characteristics of power distributed through one or more power conductors, said method comprising gripping a power conductor between a pair of clamping elements on opposite sides of said conductor, installing a current transformer core divided into at least two parts against the outer surfaces of said clamping elements on opposite sides of said power conductor, said transformer producing a current signal corresponding to current passing through said power conductor, said transformer core parts and said clamping elements having engaging surfaces that prevent relative movement between said engaging surfaces in a direction parallel to the axis of said power conductor when said clamping elements are pressed against said power conductor in a direction transverse to the axis of said power conductor, and making electrical contacting said power conductor with a voltage sensor to produce a voltage signal corresponding to the voltage on said power conductor, wherein different spacings between said clamping elements are accommodated without changing the size of said transformer core parts, by providing said clamping elements and said transformer core parts with engaging surfaces that are angled and that are longer on said clamping elements than on said transformer core parts, and adjusting the longitudinal positions of said transformer core parts relative to said clamping elements to accommodate different spacings between said clamping elements.

26. The method of claim 25 which includes a voltage probe extending through one of said clamping elements, in a direction transverse to the axis of said power conductor, and making electrical contact with said power conductor for producing a voltage signal corresponding to the voltage on said power conductor.

27. The method of claim 25 in which at least one of said transformer core parts includes a winding on said core.

28. The method of claim 25 in which said current transformer is housed in an enclosure and said current and voltage signals are converted to digital signals in electrical circuitry contained in said enclosure.

29. The method of claim 28 wherein said circuitry includes a burden resistor for said current transformer and a voltage divider for said voltage sensor.

30. The method of claim 25 in which said AC line voltage from said power conductor is converted to a reduced DC control voltage for the power monitoring system, in electrical circuitry integrated into a base module.

31. The method of claim 25 in which the surfaces of said clamping elements that grip opposite sides of said power conductor form interdigital ribs that bite into insulation on said power conductor when said clamping elements are pressed against said insulation on opposite sides of said conductor.

* * * * *